United States Patent
Colasanti et al.

(10) Patent No.: US 12,068,737 B2
(45) Date of Patent: Aug. 20, 2024

(54) ACOUSTIC FILTER WITH IMPROVED REFLECTIVITY

(71) Applicant: RF360 SINGAPORE PTE. LTD., Republic Plaza (SG)

(72) Inventors: Simone Colasanti, Munich (DE); Samir Tazarine, Munich (DE); Robert Koch, Munich (DE); Franz Kubat, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 433 days.

(21) Appl. No.: 17/297,906

(22) PCT Filed: Dec. 13, 2019

(86) PCT No.: PCT/EP2019/085086
§ 371 (c)(1),
(2) Date: May 27, 2021

(87) PCT Pub. No.: WO2020/126909
PCT Pub. Date: Jun. 25, 2020

(65) Prior Publication Data
US 2022/0045663 A1    Feb. 10, 2022

(30) Foreign Application Priority Data
Dec. 19, 2018   (DE) .................... 10 2018 132 881.8

(51) Int. Cl.
*H03H 9/54*    (2006.01)
*H03H 9/02*    (2006.01)
(Continued)

(52) U.S. Cl.
CPC ........ *H03H 9/542* (2013.01); *H03H 9/02102* (2013.01); *H03H 9/02834* (2013.01); *H03H 9/17* (2013.01); *H03H 9/568* (2013.01)

(58) Field of Classification Search
CPC ............... H03H 9/542; H03H 9/02102; H03H 9/02834; H03H 9/17; H03H 9/568
See application file for complete search history.

(56) References Cited

U.S. PATENT DOCUMENTS

2006/0066419 A1    3/2006 Iwaki et al.
2011/0248794 A1    10/2011 Klamm et al.
(Continued)

FOREIGN PATENT DOCUMENTS

| JP | 2004289760 A | 10/2004 | |
|---|---|---|---|
| JP | 2013110655 A | * 6/2013 | ......... H03H 9/02102 |
| WO | 2019025154 | 2/2019 | |

OTHER PUBLICATIONS

International Search Report and Written Opinion—PCT/EP2019/085086—ISA/EPO—dated Mar. 10, 2020.
(Continued)

*Primary Examiner* — Andrea Lindgren Baltzell
*Assistant Examiner* — Kimberly E Glenn
(74) *Attorney, Agent, or Firm* — Polsinelli

(57) ABSTRACT

A filter circuit comprises a main operating unit (MU) arranged in the series signal line providing most of the filter function of the filter circuit. A micro acoustic last series resonator ($RL_s$) as a last element of the main operating unit in the series signal line is prone to excite a spurious mode that is damped with a final series capacitance ($CE_s$) circuited between the last element and the antenna terminal (AT).

12 Claims, 4 Drawing Sheets

(51) Int. Cl.
*H03H 9/17* (2006.01)
*H03H 9/56* (2006.01)

(56) References Cited

U.S. PATENT DOCUMENTS

2017/0214390 A1  7/2017  Tsukamoto et al.
2018/0138890 A1  5/2018  Kubat

OTHER PUBLICATIONS

Figure 1:
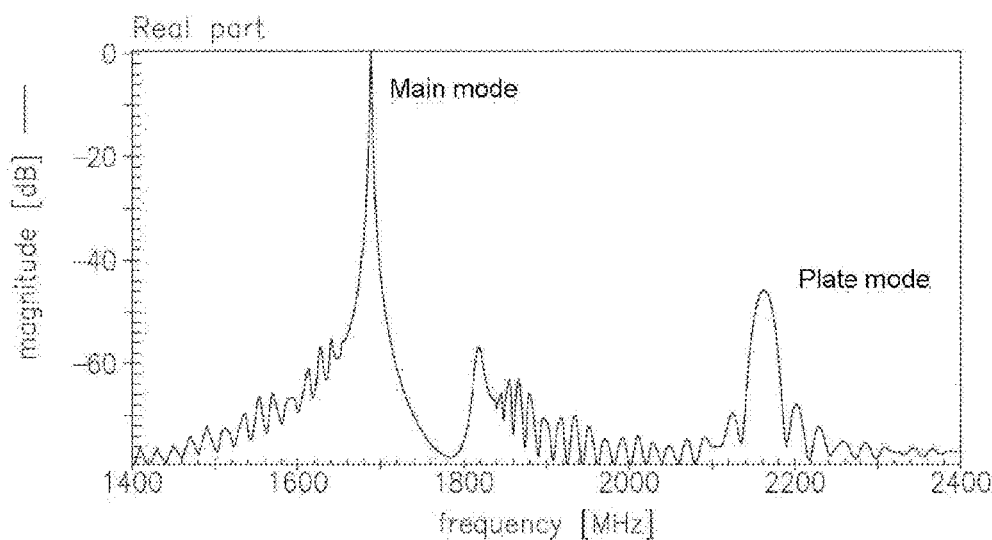

Jamneala T., et al., "A Generic Passive Matching Network for Multiplexers", IEEE Transactions on Ultrasonics, Ferroelectrics and Frequency Control, vol. 54, No. 6, Jun. 2007 (Jun. 2007), pp. 1272-1275, XP011186285, abstract; figure 1.
Shinpei O., et al., "A Design Method of Matching Circuits for a Compact Diplexer using Saw Filters", International Conference on Electronics Packaging, Apr. 2016 (Apr. 2016), pp. 23-26, XP032909565, [retrieved on Jun. 7, 2016] section II, figure 6.

* cited by examiner

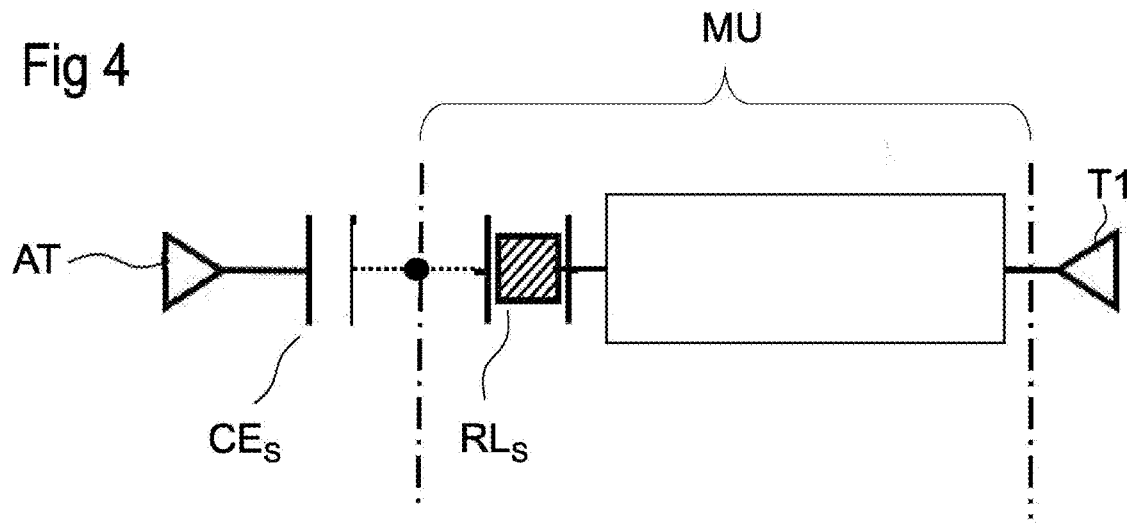
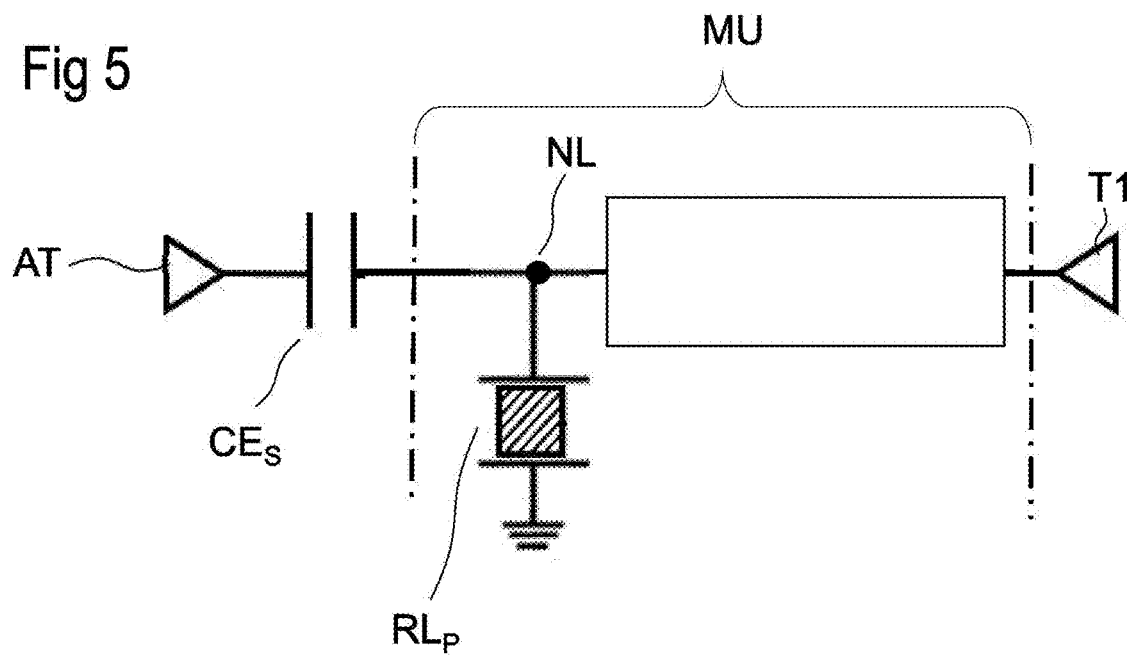

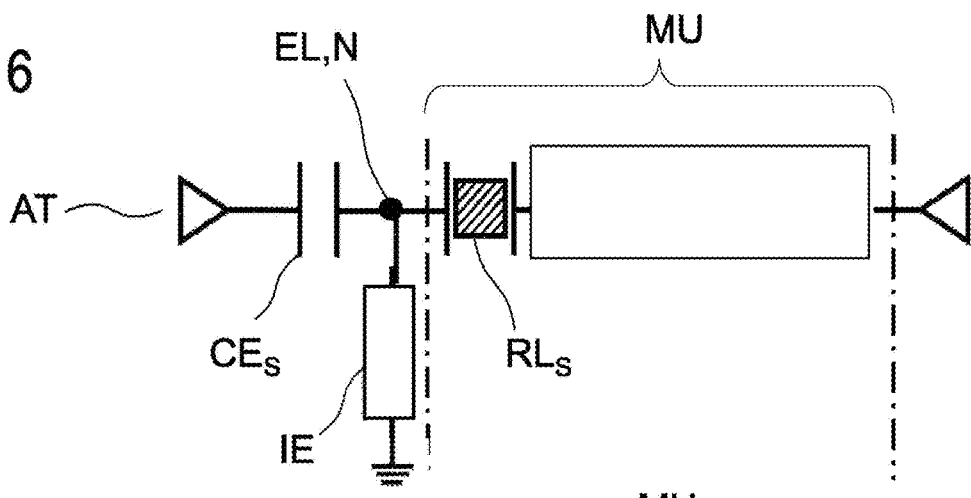
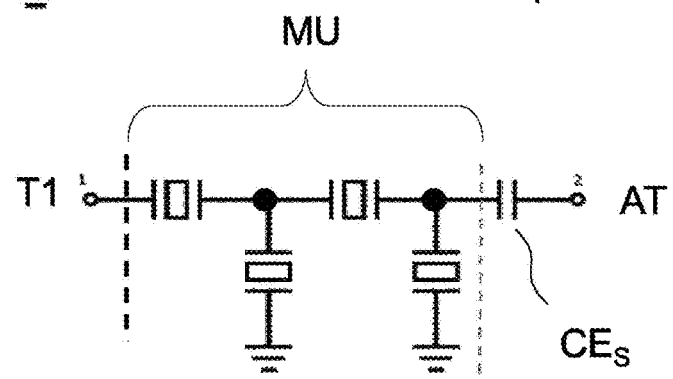
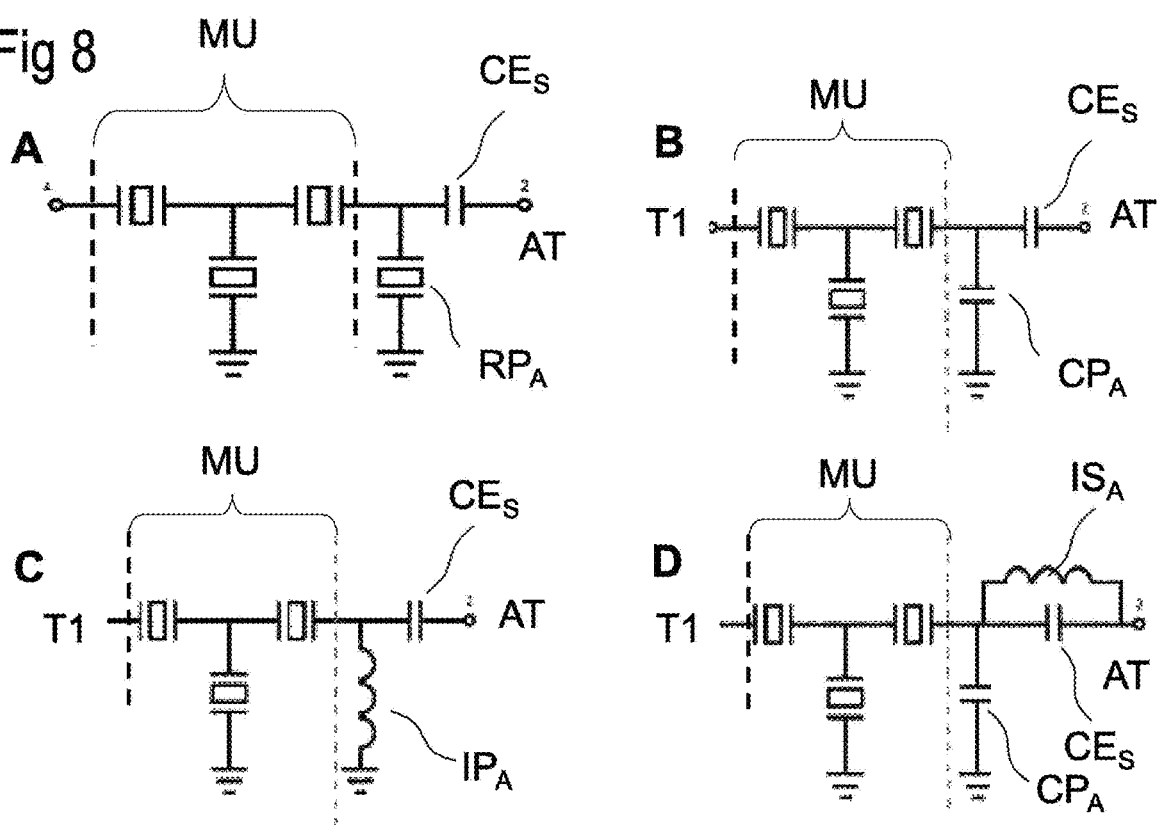

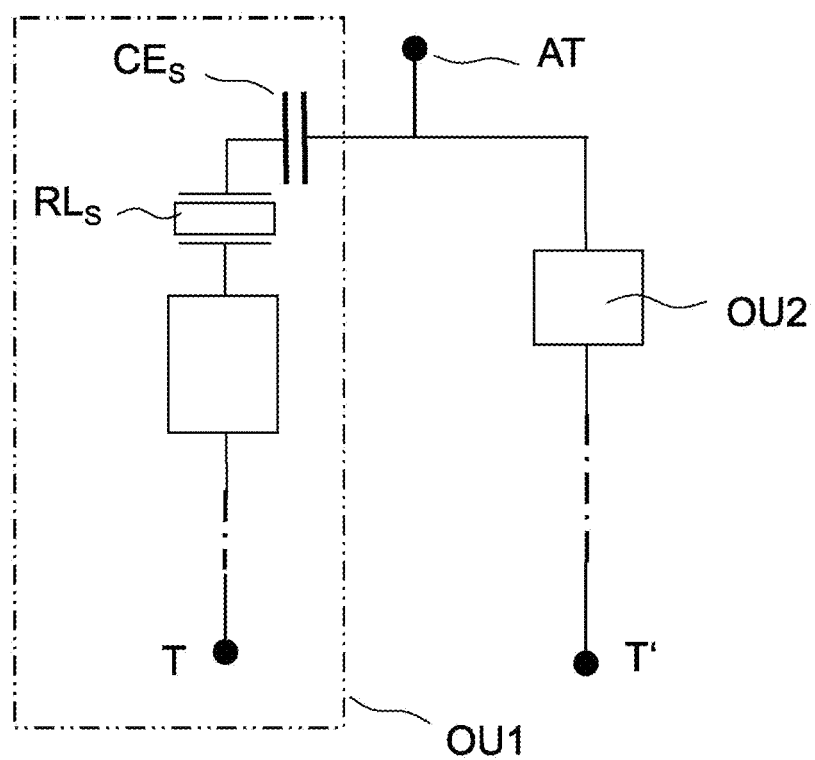

ACOUSTIC FILTER WITH IMPROVED REFLECTIVITY

The present invention provides an approach to acoustic filters with improved reflectivity allowing an efficient multiplexing of these acoustic filters which are otherwise affected by spurious modes.

In the so-called TC-SAW filters (temperature compensated SAW filters), the resonators are commonly covered with a dielectric layer to reduce the sensitivity of the filters to temperature variations. In addition to the main mode propagating in such a filter, the layer stack with such structure causes another spurious mode to propagate. The excitation of this secondary mode, also known as plate mode, depends on the properties of the dielectric layer. In some cases, to fulfill specifications on the temperature coefficient of the filter, it is necessary to deposit thick layer of dielectric that causes a strong excitation of the plate mode.

The position of these disturbing modes may collide with other LTE bands. As more and more applications use new band combinations, the required selectivity and reflectivity of the single filters is more and more challenging. Hence, occurrence of spurious modes becomes an increasing problem.

A known method of handling spurious modes is to move them out of the band where they are disturbing. This can be done by modifying the resonator that causes the unwanted mode.

However, displacement of disturbing modes impairs the performance of the resonator that causes them. The excitation of disturbing modes is related to the quality factor of the resonators. Reducing the excitation of these modes leads to reduced quality factors, and consequently, to reduced performance.

Further, it is possible to provide an additional pole by inserting or modifying a shunt line to produce a resonance at the frequency of the spurious mode. Due to the limited Q-factor of real passive elements, such a shunt resonance is not particular selective in dealing with the spurious mode. In other words, the pole in the transfer function normally affects other bands negatively as well.

It is hence an object of the invention to provide a filter circuit that suppresses spurious modes especially in suppress spurious modes (i.e. plate modes, bulk waves etc.) especially in multi-layer stacked acoustic wave filters and resonators (SAW/BAW).

This and other objects are solved by a filter circuit according to claim 1.

Further embodiments and advantageous features can be taken from further claims.

A filter circuit providing a pass band comprises a series signal line that connects a first terminal and an antenna terminal.

A main operating unit is arranged in the series signal line providing most of the filter function of the filter circuit thereby creating a pass band. A micro acoustic series resonator is a last element arranged in the series signal and part of the main operating unit. At last, a final series capacitance is circuited between the last element and the antenna terminal as an additional element.

Optionally one or more parallel branches may connect a respective node in the series signal line to a ground terminal. A parallel resonator may be arranged in one of the parallel branches.

The proposed filter circuit successfully suppresses spurious modes like plate modes and bulk modes that may be excited due to a stacked design of the last resonator.

The inventors have found out that the main disturbing effect of spurious modes is produced by the last stage of the filter circuit that may be by the last element next to the antenna terminal. In the present case the last series resonator is prone to produce such modes.

These modes, which are excited at frequencies far from the main mode frequency of the resonator, negatively affect the reflectivity at the antenna terminal and hence, the selectivity of the filter circuit. The key for a good multiplexing is that the reflectivity at the antenna does not present any spike coming from any unwanted spurious mode. This object is achieved with the presented filter circuit ending with the final series capacitance next to the antenna terminal.

The filter circuit may be formed on a substrate being a carrier only or provide with a functional material like a piezoelectric layer. According to an embodiment the final series capacitance may be an external discrete element. Alternatively the final series capacitance may be an integrated capacitance on the substrate. This may be a resonator that acts with its static capacitance only and has a resonance frequency outside the pass band.

The last element in the signal line next to the final capacitance is the last series resonator. According to a further embodiment a further node is arranged in the series signal line between the last element and the final series capacitance. A further parallel branch is circuited between the further node and a ground terminal as a further additional element and comprises an impedance element chosen from a further parallel resonator, a parallel coil and a parallel capacitance.

A parallel capacitance may be arranged in the further parallel branch and a series coil may be circuited in parallel to the final series capacitance.

According to another embodiment a phase shifting circuit is formed and circuited between the main operating unit and the antenna terminal. This circuit comprises the last series resonator, a parallel coil arranged in the last parallel branch and the final series capacitance in the series signal line.

According to further embodiment the main operating unit ends with a last node and a last parallel branch is connected to the last node. A parallel micro-acoustic resonator is arranged in the parallel branch. Said last node is directly connected to the final series capacitance and the final series capacitance is directly connected to the antenna terminal.

The main operating unit that provides most of the filter function may comprise a ladder type arrangement of series and parallel resonators. The resonators of the ladder type arrangement may comprise SAW or BAW resonators.

Alternatively the main operating unit may be embodied in an arbitrary other technology. In an example, the main operating unit comprises a DMS filter series-connected to a micro-acoustic series resonator.

In all embodiments, the last series resonator may be a temperature compensated thin film SAW resonator or a BAW resonator.

In an advantageous sophisticated application a first operating unit comprising the proposed filter circuit and a second micro-acoustically operating unit chosen from a passband filter circuit or a notch-filter are connected to the same antenna terminal in a permanent or switchable form. First or second operating unit comprises a micro acoustic resonator next to the antenna terminal. As this resonator next to the antenna terminal is prone to produce a spurious mode in the operating frequency band of the respective other unit the final series capacitance is included to suppress this spurious mode.

In the following the invention is explained in more detail with reference to specific embodiments and the related schematic figures.

Figure 2:
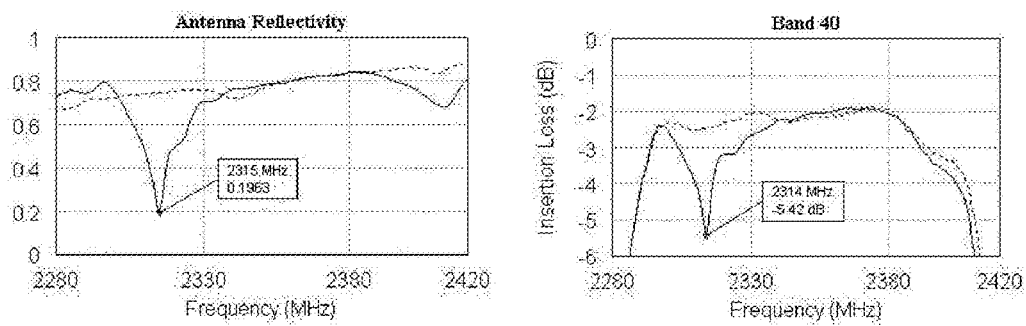
Figure 3:
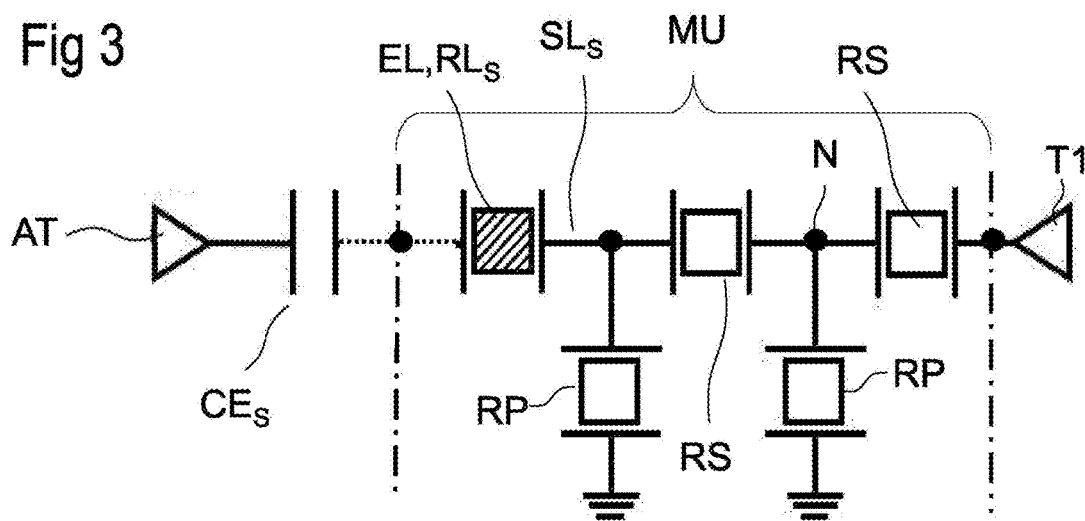

FIG. 1 shows an admittance curve of a filter circuit with a main mode and a plate mode as a spurious mode FIG. 2 shows at A the antenna reflectivity around the frequency of the spurious mode and at B a pass band of another operating unit that is lying within the frequency range of the spurious mode FIG. 3 shows a first embodiment of the invention with a ladder type arrangement of resonators as main operating unit FIG. 4 shows a generalized structure of the first embodiment where the main operating unit may be an arbitrary filter circuit ending with a last series resonator at the antenna side thereof FIG. 5 shows another general structure of a further first embodiment where the main operating unit may be an arbitrary filter circuit ending with a last parallel branch and a parallel resonator at the antenna side thereof FIG. 6 shows another embodiment where the main operating unit is chosen similar to the embodiment of FIG. 3 may be an arbitrary filter circuit ending with a last parallel branch and a parallel impedance element at the antenna side thereof FIG. 7 shows an embodiment where the main operating unit is a ladder type arrangement of resonators ending with a last parallel branch and a parallel resonator arranged therein FIG. 8A to 8D show embodiments where the main operating unit is a ladder type arrangement of resonators ending with a last series resonator and different additional elements comprising a last series capacitance are added FIG. 9 shows an embodiment where a first and a second operating unit are coupled to the same antenna terminal and one of first and second operating unit is ending with a last series resonator.

FIG. 1: In example, a B1/B3 quadplexer is connected at the same antenna with a B40 filter. A spurious mode coming from B3 TX filter negatively affects the performance of the B40 filter. A severe spike in the antenna reflectivity is visible as shown in FIG. 2A. This leads to a drop in the pass band of the B40 filter as shown in FIG. 2B. The solid line represents a B3 TX filter affected by a spurious mode, whereas the dashed line is the same filter without the effect of a spurious mode.

According to the invention, the real challenge is to find a way to completely suppress the spurious modes rather than trying to move them out of the main bands. In the example represented in FIG. 1, a resonator designed to have his main mode in Band 3 (uplink) has its plate mode in Band 1 (downlink). If such a resonator would be used in a multiplexed application (band 1+band 3), the overall performance would suffer considerably due to a mediocre cross-isolation between the two operating bands.

One could try to move the plate mode in frequency, but this will result in violations of other constraints (e.g. in case of carrier aggregation with Band 40).

From a circuit level point of view, the nature of the unwanted mode is rather irrelevant. Here, the attention is more focused on how an unwanted mode from a filter "A" negatively affects a second filter "B" which is connected to the same antenna terminal. The answer to such question can be found in the reflectivity at the antenna, as represented in FIG. 2A. A bad reflectivity in a specific frequency range (e.g. the spike of the unwanted mode) means that there is energy leaking in another filter. This effect can be thought as a very pronounced frequency-localized loss caused by one filter to the other.

As it will be clearer after the following sections, the invention aims to cover not only unwanted modes from SAW filters, but more generally, seeks to cover a broader range of cases (e.g. spurious modes in BAW filters or other filter technologies like DMS filter when circuited with a micro-acoustic resonator).

The idea comes from the observation that the spikes in the reflectivity are caused mainly from the resonators close to the antenna. The effects of other resonators are quickly vanishing while moving along the ladder topology from the antenna to the first terminal (i.e. the other port). This can be mathematically proven by separating each stage of the filter (e.g. shunt/series resonator+series/shunt resonator) into a cascade of multiple 2-ports networks.

Since the spikes are caused only/mainly by the last stage at the antenna side of the filter, the idea is to add an additional stage or replace one or two elements of the existing last stage) with one of the following solutions:

Adding a passive capacitor (this can be a series or a shunt resonator) and leaving the original resonator (if its unwanted mode does not create any trouble)

Adding a stage with two passive capacitors (a series and a shunt capacitor) and leaving the original resonator (if its unwanted mode does not create any trouble)

Adding a passive capacitor and a resonator that does not create any trouble)

Replacing the resonator causing the unwanted mode by a passive capacitor. This can be a series or a shunt resonator which has to be replaced by a respective series or a shunt capacitor.

FIG. 3 shows a filter circuit wherein the main operating unit MU is the original filter unit with a last series resonator RLS at the side of the antenna terminal AT. The main operating unit MU comprises a ladder type arrangement of series resonators RS arranged in a series signal line SL between an antenna terminal AT and a first terminal T1. Parallel branches with parallel resonators RP arranged therein are connecting nodes N in the series signal line SL to ground terminals. A final series capacitance CES is added and inserted into the filter circuit between the last series resonator RLS and the antenna terminal AT.

FIG. 4 shows a more general embodiment using the same idea. The main operating unit MU providing most of the pass band filter function may be embodied in an arbitrary technology that can provide the aimed pass band. Preferably an acoustic filter is used such like SAW, BAW or DMS. However, an LC filter made from discrete or integrated passive elements is possible too. This main operating unit MU if circuited in series with a last series resonator RLS may cause spikes that may disturb other bands. Hence, here too a final series capacitance CES is circuited between antenna terminal AT and last series resonator RLS to suppress the spurious mode.

FIG. 5 shows another embodiment wherein an arbitrary main operating unit MU ends up with a last node NL and a parallel branch with a last parallel resonator RLP is connected to this last node. This last parallel resonator RLP is prone to excite spurious modes that are suppressed by the final series capacitance CES.

According to the embodiment shown in FIG. 6 the same main operating unit MU ending with a last series resonator RLS is used. A parallel impedance element IE is added as a new shunt element in the filter circuit and a final series capacitance CES is added between last series resonator and the antenna terminal. The added final series capacitance may be an external capacitor or a capacitor in the filter circuit for example a resonator with a resonance frequency that is far away from the used bands.

In this way the following effects are obtained:

Matching of the filter is practically unaltered. Same topology can be used and only one more stage is necessary. This causes presumably only small losses due to the greater number of elements, but at the same time there is more freedom in the trade-off between selectivity/in-band attenuation. Adding stages usually helps with selectivity, but on the other hand increases the losses (therefore the insertion loss). If the level of selectivity achieved before the introduction of this additional stage was already sufficient, one can re-optimize the filter to recover the small additional insertion loss. Small additional losses can in principle be compensated through the re-design of the filter.

The last series resonator RLS (with its plate mode) is not the last element of the filter circuit anymore. At the antenna terminal AT, incoming waves will now see first the final series capacitance CES, and thus they will not excite any plate-mode.

It is worth to mention that the plate-mode will be still excited, but its intensity will be much less pronounced since there is an additional stage between the last series resonator RLS and the antenna.

Further, the proposed approach does negative impact on other bands that may be used in connection with the filter circuit and may be connected to the same antenna terminal AT.

Once again, for sake of clarity, the series element can be either external or be directly integrated on-chip. In FIG. 7 the main operating unit MU ends at the antenna side with a parallel branch and a parallel resonator arranged therein. The final series capacitance is represented as a capacitor, since its main purpose is to act as capacitor. However, there is the possibility of also using an additional series resonator instead of a capacitor. This approach is efficient in damping a spurious mode coming from the last series resonator but reduces the intensity of the parallel as well.

In case the main operating unit ends with a last series resonator at the antenna different damping stages can be added, as schematically represented in FIG. 8:

A) An additional parallel resonator RPA can be introduced (on-chip) between main operating unit MU and final series capacitance CES. In this way the last series resonator causing the spurious mode is not the closest to the antenna anymore, its spurious mode dis damped and the filter keeps the same ladder topology with only one stage more.

B) In a variant of case A) the additional parallel resonator RPA is substituted with an additional parallel capacitance CPA. This is useful when both last resonators, last series and last parallel resonator, are causing problems with unwanted modes in counter-bands. Other more complicated networks are allowed too. In these topologies, two (or more) elements are added in series to the filter to cause a phase-shifting of the filter at the antenna terminal.

C) In this case an additional parallel coil IPA is introduced between main operating unit MU and final series capacitance CES. If the static capacitance of the last series resonator RSL is considered, a high pass T phase-shifter (series capacitance, shunt coil, series capacitance) is achieved.

D) In this last case a parallel resonant circuit comprising a final series capacitance CES parallel to an additional series coil ISA creates a resonance in the frequency range of the unwanted spurious mode. The final series capacitance close to the filter helps in recovering the matching.

FIG. 9 shows an embodiment where a first and a second operating unit OU1,OU2 are coupled to the same antenna terminal and one of first and second operating unit is ending with a last series resonator RLS. The first operating unit OU may be a filter circuit as described above according to FIG. 4 for example. The second operating unit OU2 may be an arbitrary filter or notch circuit operating with a frequency band that complies with the frequency of a spurious mode the last series resonator is prone to excite. By the proposed final series capacitance CES this mode is damped and the disturbance in the operating frequency band of the second operating unit is minimized.

All presented filter circuits have shown the capability of damping the spurious modes by replacing an element (or in case necessary, even both elements) of the last stage of a ladder-topology filter or another filter technology/topology with passive elements which do not present any spurious mode.

A preferred application of the presented filter circuit in a system is shown in FIG. 9.

A system consists of minimum two different acoustical operating units (e.g. BAW-/SAW-filter, -notch) which are connected temporary or permanent in a system (e.g. module).

One operating unit creates spurious modes which affect in a critical frequency range the performances of second unit (e.g. filter, duplexer of a quadplexer).

Very critical are spurious modes if they are excited in an acoustical operating unit close to the connection of the two operating units (e.g. antenna terminal within a quadplexer).

The progressive handling of spurious modes may demand a rework of the last sub-unit of the main operating unit (in case of a SAW filter the last IDT) or/and the electro-magnetic environment between the last sub-unit and the connection point of the two operating units.

The rework could include a partial (parallel capacity, resonator with different pitch) or fully replacement of the last sub-unit by an alternative electric element (e.g. coil, capacitor, damping circuit . . . ) which does not create any spurious modes in general or at least not in the critical frequency range.

The invention has been explained with reference to a limited number of embodiments but is not limited to these specific embodiments. The full scope of the invention is defined by the claims.

LIST OF USED TERMS AND REFERENCE SYMBOLS

AT antenna terminal
CES final series capacitance
CPA additional parallel capacitance
EL last element
IPA additional parallel coil
ISA additional series coil
MU main operating unit
N node
NL last node
OU1,OU2 operating units
RLP last parallel resonator
RLS last series resonator
RP parallel resonator
RPA additional parallel resonator
RS series resonator SLS series signal line
T,T' terminals
T1 first terminal

The invention claimed is:

1. A filter circuit that provides a pass band, comprising:
a series signal line that connects a first terminal and an antenna terminal;
a main operating unit arranged in the series signal line providing a filter function of the filter circuit;
a micro acoustic last series resonator that is a last element in the series signal line and part of the main operating unit; and
a final series capacitance circuited between the last element and the antenna terminal, wherein the main operating unit ends with a last node and a last parallel branch connected to the last node, wherein a parallel micro-acoustic resonator is arranged in the last parallel branch, and wherein the last node is directly connected to the final series capacitance and the final series capacitance is directly connected to the antenna terminal.

2. The filter circuit of claim 1,
wherein the filter circuit is formed on a substrate, and
wherein the final series capacitance is embodied as an external discrete element or as an integrated capacitance on the substrate or is a resonator acting with its static capacitance only and having a resonance frequency outside the pass band.

3. The filter circuit of claim 1,
wherein a further node is arranged in the series signal line between the last element and the final series capacitance, and
wherein a further parallel branch is circuited between the further node and a ground terminal, the further parallel branch comprising an impedance element chosen from a further parallel resonator, a parallel coil and a parallel capacitance.

4. The filter circuit of claim 3,
wherein an additional parallel capacitance is arranged in a further parallel branch, and
wherein an additional series coil is circuited in parallel to the final series capacitance.

5. The filter circuit of claim 1, wherein a phase shifting circuit is circuited between the main operating unit and the antenna terminal, the phase shifting circuit comprising the micro acoustic last series resonator, an additional parallel coil (IPA) arranged in the last parallel branch and the final series capacitance in the series signal line.

6. The filter circuit of claim 1, wherein the main operating unit comprises a ladder type arrangement of series and parallel resonators.

7. The filter circuit of claim 6, wherein resonators of the ladder type arrangement comprise surface acoustic wave (SAW) or bulk acoustic wave (BAW) resonators.

8. The filter circuit of claim 1,
wherein the main operating unit comprises a DMS filter series-connected to a micro-acoustic series resonator.

9. The filter circuit of claim 1,
wherein the micro acoustic last series resonator is a temperature compensated thin film surface acoustic wave (SAW) or bulk acoustic wave (BAW) resonator.

10. The filter circuit of claim 1,
wherein a first operating unit comprising the filter circuit and a second micro-acoustically operating unit chosen from a passband filter circuit or a notch-filter are connected to the antenna terminal in a permanent or switchable form,
wherein the first operating unit or the second micro-acoustically operating unit comprise a micro acoustic resonator coupled to the antenna terminal,
wherein this resonator coupled to the antenna terminal is prone to produce a spurious mode in an operating frequency band of a respective other unit, and
wherein the final series capacitance suppresses the spurious mode.

11. A filter circuit that provides a pass band, comprising:
a series signal line that connects a first terminal and an antenna terminal;
a main operating unit arranged in the series signal line a filter function of the filter circuit;
a micro acoustic last series resonator that is a last element in the series signal line and part of the main operating unit; and
a final series capacitance circuited between the last element and the antenna terminal;
wherein the final series capacitance is directly connected the antenna terminal.

12. A filter circuit that provides a pass band, comprising:
a series signal line that connects a first terminal and an antenna terminal;
a main operating unit arranged in the series signal line a filter function of the filter circuit;
a micro acoustic last series resonator that is a last element in the series signal line and part of the main operating unit;
a final series capacitance circuited between the last element and the antenna terminal;
a further parallel branch comprising an additional parallel capacitance; and
an additional series coil parallel to the final series capacitance.

* * * * *